United States Patent [19]

Miura et al.

[11] Patent Number: 4,591,798
[45] Date of Patent: May 27, 1986

[54] FM SIGNAL DEMODULATION CIRCUIT

[75] Inventors: Kuniaki Miura, Ibaraki; Yasunori Kobori, Katsuta; Isao Fukushima, Katsuta; Makoto Shiomi, Katsuta; Kenji Kano, Katsuta, all of Japan

[73] Assignee: Hitachi, Ltd., Tokyo, Japan

[21] Appl. No.: 601,290

[22] Filed: Apr. 17, 1984

[30] Foreign Application Priority Data

Apr. 18, 1983 [JP] Japan .................................. 58-66954

[51] Int. Cl.[4] .............................................. H03D 1/18
[52] U.S. Cl. ................................... 329/102; 329/103;
329/107; 329/126; 375/94; 455/214
[58] Field of Search ............... 329/102, 103, 106, 107,
329/110, 126, 192; 375/44, 80, 94; 455/214, 337

[56] References Cited

U.S. PATENT DOCUMENTS

| 3,121,202 | 2/1964 | Gray | 455/337 X |
| 3,878,470 | 4/1975 | Boltz, Jr. | 329/106 X |
| 4,264,867 | 4/1981 | Ishii | 329/110 X |
| 4,471,312 | 9/1984 | Severin | 329/103 |

Primary Examiner—Eugene R. LaRoche
Assistant Examiner—J. C. Lee
Attorney, Agent, or Firm—Antonelli, Terry & Wands

[57] ABSTRACT

An FM signal demodulation circuit comprises a plurality of inverters and a capacitor. Each of the inverters is constituted by an integrated injection logic (I²L) including a transistor and an injector current source.

8 Claims, 14 Drawing Figures

FM SIGNAL DEMODULATION CIRCUIT

This invention relates to an FM signal demodulation circuit suitable for use in a reproduction circuit of a video tape recorder or the like.

Figure 1:
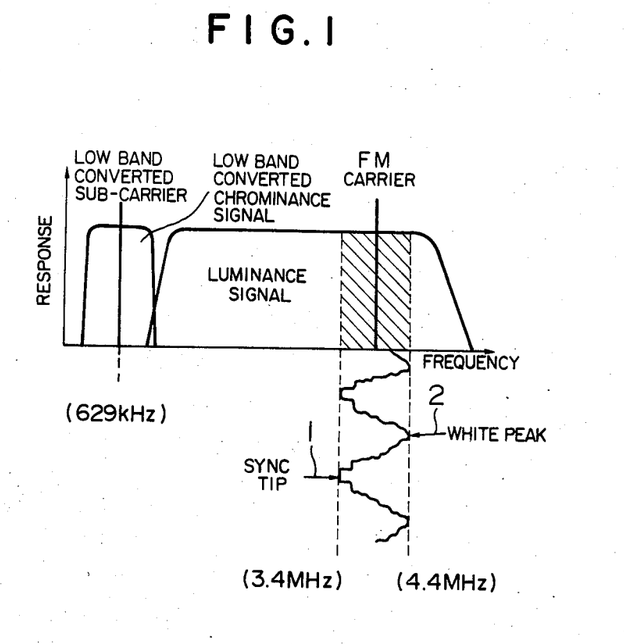
FIG. 1 is a graphical representation useful in explaining an FM carrier frequency band in video tape recorders.

It has hitherto been practice to frequency modulate luminance signals for effecting recording with domestic video tape recorders. To this end, in the case of a VHS type video tape recorder, for example, a carrier is used which defines a sync tip (tip of the synchronizing signal) 1 at 3.4 MHz and a white peak (peak white level of the video signal) 2 at 4.4 MHz so as to occupy a band of about 1 MHz, as shown in FIG. 1.

Figure 2:
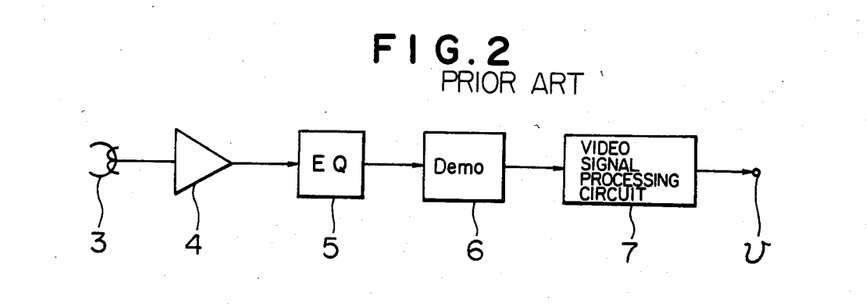
FIG. 2 is a block diagram showing a reproduction circuit of a prior art video tape recorder.

FIG. 2 illustrates, in block form, a reproduction circuit used in this type of video tape recorder. As shown, a signal reproduced by a head 3 is amplified by a pre-amplifier 4 and then regenerated and equalized by means of an equalizer 5. Subsequently, a resulting signal is demodulated by a demodulation circuit 6 and passed through a video signal processing circuit 7 to provide a video signal v. Typically, the demodulation circuit 6 is of a pulse count type.

Figure 3:
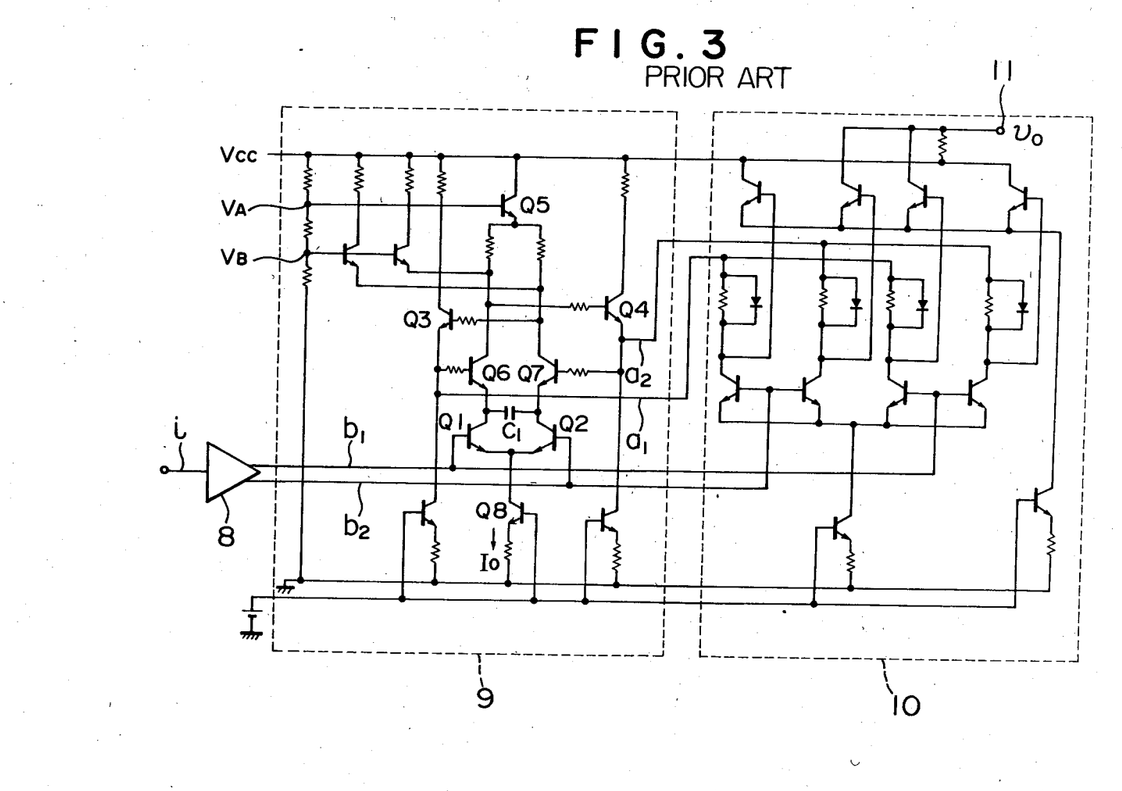
FIG. 3 is a circuit diagram of a prior art FM signal demodulation circuit.
Figure 4:
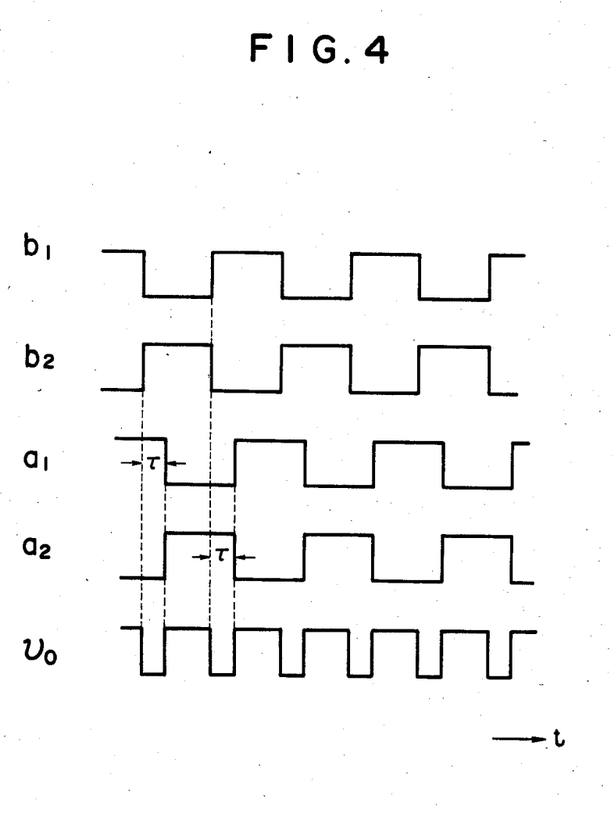
FIG. 4 is a time chart showing signal waveforms appearing at essential parts of the FIG. 3 circuit.

FIG. 3 illustrates a prior art pulse count type demodulation circuit, and FIG. 4 illustrates signal waveforms appearing at the essential parts of the FIG. 3 circuit.

An input signal i is inputted to a limiter 8, which in turn delivers wave-shaped output signals $b_1$ and $b_2$ which are out of phase from each other by 180°. These output signals $b_1$ and $b_2$ are respectively applied to bases of transistors $Q_1$ and $Q_2$ included in a delay circuit 9, so that signals $a_1$ and $a_2$ are produced from emitters of transistors $Q_3$ and $Q_4$, respectively, these signals $a_1$ and $a_2$ being delayed by a delay time $\tau$ with respect to those signals $b_1$ and $b_2$ at the bases of the transistors $Q_1$ and $Q_2$. The signals $a_1$, $a_2$, $b_1$ and $b_2$ are multiplied by a subsequent stage of a multiplier 10. As a result, an output signal $v_o$ having a waveform as shown in FIG. 4 is delivered out of an output terminal 11 of the multiplier 10. This output signal $v_o$ is passed through a low-pass filter, thereby providing a demodulated signal.

The delay time $\tau$ is given by the following equation (1):

$$\tau = \frac{2C(V_A - V_B)}{I_o} \quad (1)$$

where C is a capacitance of a capacitor $C_1$ connected between collectors of the transistors $Q_1$ and $Q_2$, $I_o$ is a constant current value of a constant current source connected between a common emitter of the transistors $Q_1$ and $Q_2$ and ground, and $V_A$ and $V_B$ are voltages occurring at points as shown in FIG. 3.

The circuit of FIG. 3 essentially constitutes an astable multivibrator wherein the number of cascaded transistors $Q_5$, $Q_3$, $Q_6$, $Q_1$ and $Q_8$ amounts up to five. With the five transistors connected in tandem between a supply voltage Vcc and ground, each of the transistors requires about 1 V [(base/collector voltage $V_{BC}=0.3$ V) + (base/emitter voltage $V_{BE}=0.7$ V)] and hence the supply voltage Vcc needs to be 5 V at the least. Accordingly, if a power supply of 5 V is used, the margin of operation range is zeroed inconveniently with the result that low voltage operation at about 5 V can not be allowed. This defect leads to a fatal disadvantage, especially, in the case of portable video tape recorders wherein power consumption must be reduced.

An object of this invention is to provide an FM signal demodulation circuit capable of obviating the prior art drawbacks and being operable at low voltages.

SUMMARY OF THE INVENTION

According to this invention, there is provided an FM signal demodulation circuit comprising a first inverter for receiving a first signal, a second inverter for receiving an inverting signal of the first signal, a capacitor connected between output terminals of the first and second inverters or between each of the output terminals of the first and second inverters and ground, a third inverter connected to receive an output signal of the first inverter, a fourth inverter connected to receive an output signal of the second inverter, and a logical product circuit for ANDing output signals of the third and fourth inverters.

With the above construction, the number of cascaded transistor stages in the FM signal demodulation circuit can be reduced to one or two, thereby ensuring that the FM signal demodulation circuit can operate at a low voltage of 3 V or less. Therefore, promising reduction in power consumption and improvements in power supply noise proof characteristics can be ensured in the portable video tape recorders, giving rise to significant advantages.

BRIEF DESCRIPTION OF THE INVENTION

The present invention will be apparent from the following detailed description taken in conjunction with the accompanying drawings, in which.

DESCRIPTION OF THE PREFERRED EMBODIMENTS

The present invention will now be described by way of examples.

Figure 5:
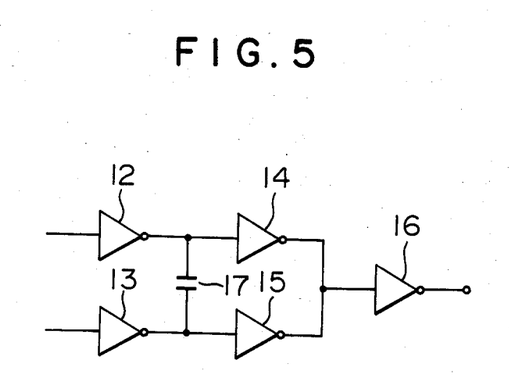
FIG. 5 is a circuit diagram showing an embodiment of an FM signal demodulation circuit in accordance with this invention.

Referring to FIG. 5, there is shown an embodiment of an FM signal demodulation circuit according to the invention which comprises five inverters 12, 13, 14, 15 and 16, and a capacitor 17 connected between output terminals of the inverters 12 and 13. Used as the inverter 12 is an integrated injection logic (hereinafter referred to as I²L) comprising a transistor 12a and an injector current source 12i as shown in FIG. 6A.

Figure 6A:
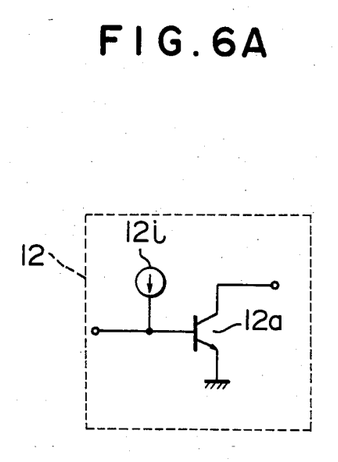
FIGS. 6A and 6B are circuit diagrams showing an inverter in the form of an integrated injection logic.
Figure 6B:
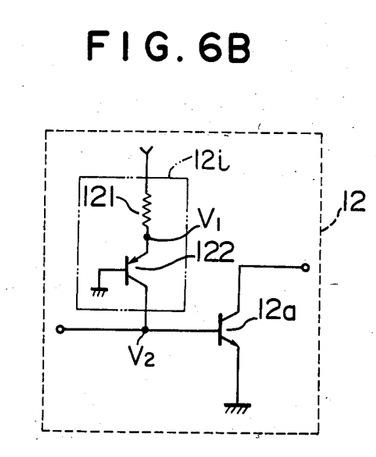

It is conceivable to use as the injector current source 12i a circuit as exemplified in FIG. 6B by comprising a resistor 121 and a PNP transistor 122. Potentials V₁ and V₂ in this circuit will not be in excess of the base/emitter voltage which is about 0.7 V. Thus, the number of cascaded transistor stages can be regarded as one, and can advantageously be adapted for low voltage operation.

Figure 7:
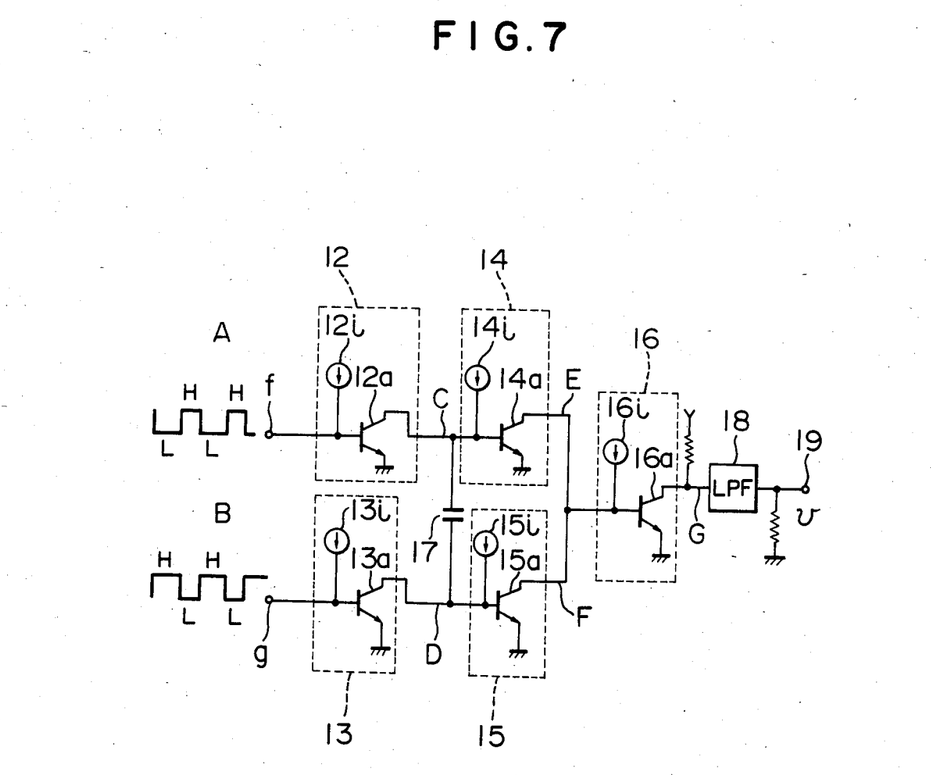
FIG. 7 is a circuit diagram for implementation of the embodiment shown in FIG. 5.

Referring to FIG. 7, the FM signal demodulation circuit of FIG. 5 is practiced through the use of the inverters in the form of I²Ls as shown in FIG. 6A. More particularly, currents from injector current sources 12i, 13i, 14i, 15i and 16i are fed to bases of transistors 12a, 13a, 14a, 15a and 16a, respectively. A frequency modulated signal A is inputted to the base (input electrode) of the transistor 12a, and a frequency modulated signal B having a phase opposite to that of the frequency modulated signal A is inputted to the base (input electrode) of the transistor 13a.

When the signal A assumes a high level (denoted by H in FIG. 7), the current of the injector current source 12i flows into the transistor 12a to turn on the same, thereby causing an output signal C from its collector (output electrode) to assume a low level. Conversely, in response to a low level (denoted by L in FIG. 7) of the signal A, the current of the injector current source 12i is drawn into an input terminal f and the transistor 12a is turned off. Consequently, the output signal C from the collector of the transistor 12a assumes a high level. Obviously, the transistor 13a operates in response to the signal B inputted to its base (input electrode) in the same manner as the transistor 12a.

The collector of the transistor 12a is connected to the base (input electrode) of the transistor 14a and the transistor 13a has its collector (output electrode) connected to the base (input electrode) of the transistor 15a. Between the collectors of the transistors 12a and 13a is connected a capacitor 17. Collectors (output electrodes) of the transistors 14a and 15a are connected in common to the base (input electrode) of the transistor 16a.

Figure 8:
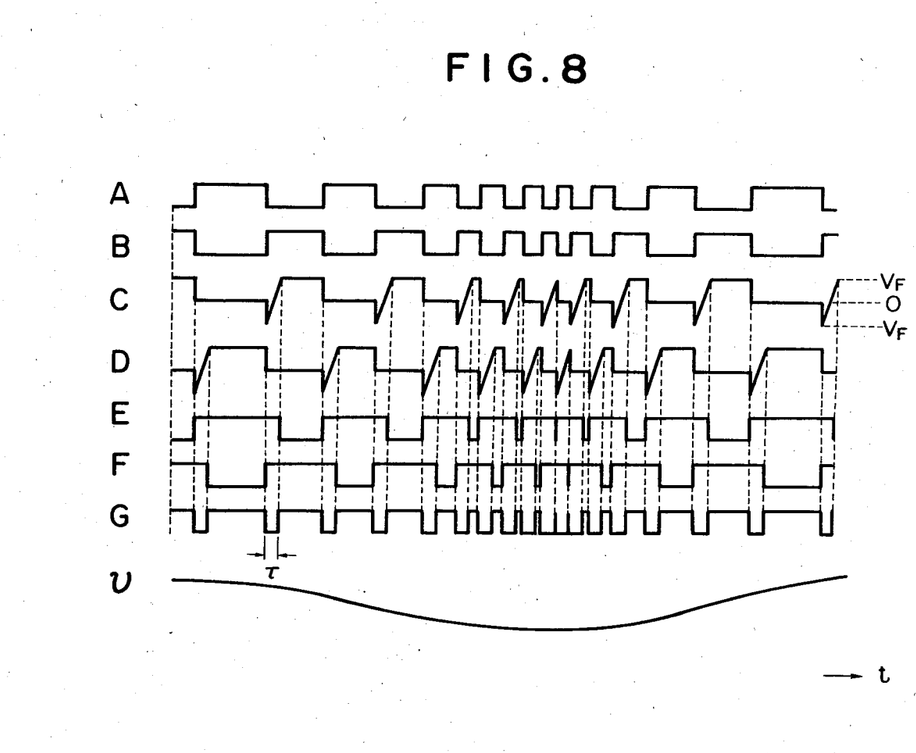
FIG. 8 is a time chart showing signal waveforms appearing at essential parts of the FIG. 7 circuit.

In order to describe that the circuit according to this embodiment operates as the FM signal demodulation circuit, reference should be made to FIG. 8 which illustrates signal waveforms appearing at the input and output electrodes of each of the transistors shown in FIG. 7. Waveforms of the frequency modulated signals A and B have phases which are opposite to each other, and a pulse height which needs to be in excess of a predetermined voltage $V_F$ (≃0.6 V).

In response to the high level of the frequency modulated signal A, the output signal C from the collector of the transistor 12a is fixed to the low level which is approximately zero volt. Simultaneously therewith, the frequency modulated signal B assumes the low level. Consequently, the transistor 13a is turned off and the capacitor 17 is charged with the current of the injector current source 15i with the output voltage signal D from the collector of the transistor 13a increased. When the voltage of the output signal D reaches the predetermined voltage $V_F$, the transistor 15a is turned on so that the voltage of the output signal D is fixed to $V_F$. Sympathetically therewith, the output signal F of the transistor 15a assumes the low level.

As a result, during a time interval in which the frequency modulated signal A is high and the frequency modulated signal B is low, the capacitor 17 is so charged and maintained as to hold the output signal C at zero volt and the output signal D at $+V_F$.

When, on the other hand, the frequency modulated signal A changes from high to low with the frequency modulated signal B changed from low to high, the transistor 12a is turned off and the transistor 13a is turned on with the output signal D fixed to zero volt. At this time, as described above, because of the potential difference of $V_F$ across the capacitor 17, the voltage of the output signal C becomes $-V_F$.

With lapse of the time, the capacitor 17 is charged with the current from the injector current source 14i until the voltage of the output signal C reaches $+V_F$ at which the transistor 14a is turned on. The output voltage signal C is then fixed to $+V_F$ with the output signal E from the collector of the transistor 14a lowered. The time, $\tau$, required for changing the voltage of the output signal C from $-V_F$ to $+V_F$ is given by the following equation (2):

$$\tau = \frac{Cd \cdot 2V_F}{Id} \tag{2}$$

where Id is a constant current from the injector current source 14i, and Cd is a capacitance of the capacitor 17.

When the frequency modulated signal A is high and the frequency modulated signal B is low, the time required for changing the voltage of the output signal D from $-V_F$ to $+V_F$ also measures $\tau$ pursuant to equation (2), provided that Id therein is interpreted as a constant current from the injector current source 15i.

If the currents of the injector sources 14i and 15i are not constant currents, $\tau$ is determined by a time constant of an impedance R on the injector current sources and the capacitance of the capacitor 17.

The output signal E from the collector of the transistor 14a and the output signal F from the collector of the transistor 15a are ANDed and applied to the base of the transistor 16a which in turn produces from its collector the output signal G in the form of a wave of expansion having a pulse width $\tau$ as shown in FIG. 8. This output signal G is passed through a lowpass filter 18 to provide a demodulated signal v on an output terminal 19.

In FIG. 8, the waveforms of the output signals E and F are those occurring prior to the logical product operation.

Important points for evaluating the performance of FM signal demodulation circuits are:

(1) Minimization of leakage of the carrier associated with the frequency modulated signals A and B to the demodulated signal; and (2) Ability to set a folding point for demodulation which is sufficiently higher than the FM carrier frequency.

With regard to item (1) above, due to the fact that the demodulation circuit according to this embodiment is of a differential type which can substantially zero the delay time differences between the inverters 12 and 13 and between the inverters 14 and 15, and that the injector currents of the injector current sources 14i and 15i can be set to be equal to each other since the injector current sources 14i and 15i can be adjusted independently of the injector current sources 12i, 13i and 16i, time dependent variations of the delay time $\tau$ can be minimized to thereby suppress the carrier leakage to an extremely small level.

Figure 9:
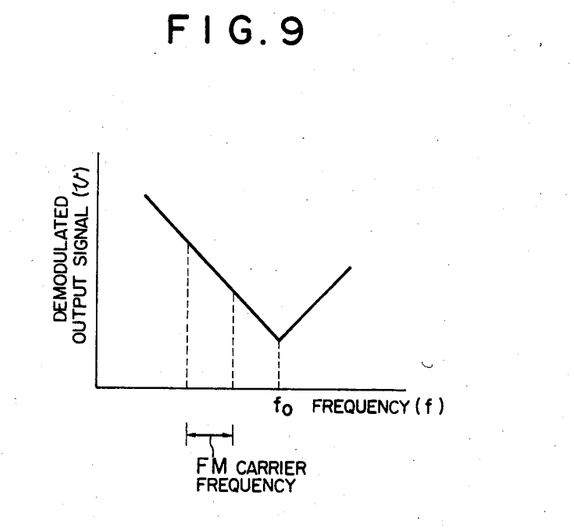
FIG. 9 shows an FM signal demodulation characteristic.

With regard to item (2), it is necessary to provide a folding frequency $f_o$ which is sufficiently higher than the FM carrier frequency as shown in FIG. 9. A maximum value $\tau_{max}$ of allowable pulse width is given by the following equation (3):

$$\tau_{max} = 1/2f_o \qquad (3)$$

Accordingly, the aforementioned delay time $\tau$ must be set to a prescribed value which satisfies, $$\tau < \tau_{max}.$$

In the case of the FIG. 7 circuit, this value of the delay time $\tau$ varies with irregularity in capacitance of the capacitor 17 and capacitances of parasitic base capacitors (not shown) of the transistors 14a and 15a or dependent on temperature characteristics of active elements used. Therefore, adjustment or temperature characteristic correction is effected in respect of the injector current sources 14i and 15i so as to set the delay time $\tau$ to the prescribed value.

Figure 10:
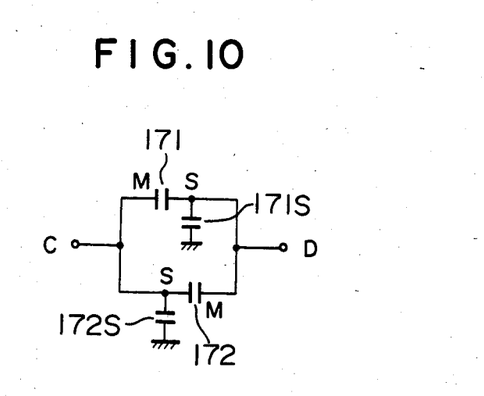
FIG. 10 is a circuit diagram of a MOS capacitor preferably used in the FM signal demodulation circuit in accordance with the invention.

Referring to FIG. 10, if a MOS type transistor is used as the capacitor 17, then parasitic capacitors 171S and 172S between the capacitor 17 and a substrate must be taken into consideration and accordingly, a metal side M and a substrate side S of either of two MOS capacitors 171 and 172 each having an equal capacitance must be connected in back to back relationship in order not to disturb the differential type configuration.

Further, in the circuit of FIG. 7, the dealy times for the individual transistors 12a and 13a vary with irregularity in parasitic capacitors (not shown) associated with the respective transistors and in currents from the injector current sources 12i and 13i, but the relative difference between those delay times can be zeroed to obviate the problem of the carrier leakage.

Figure 11:
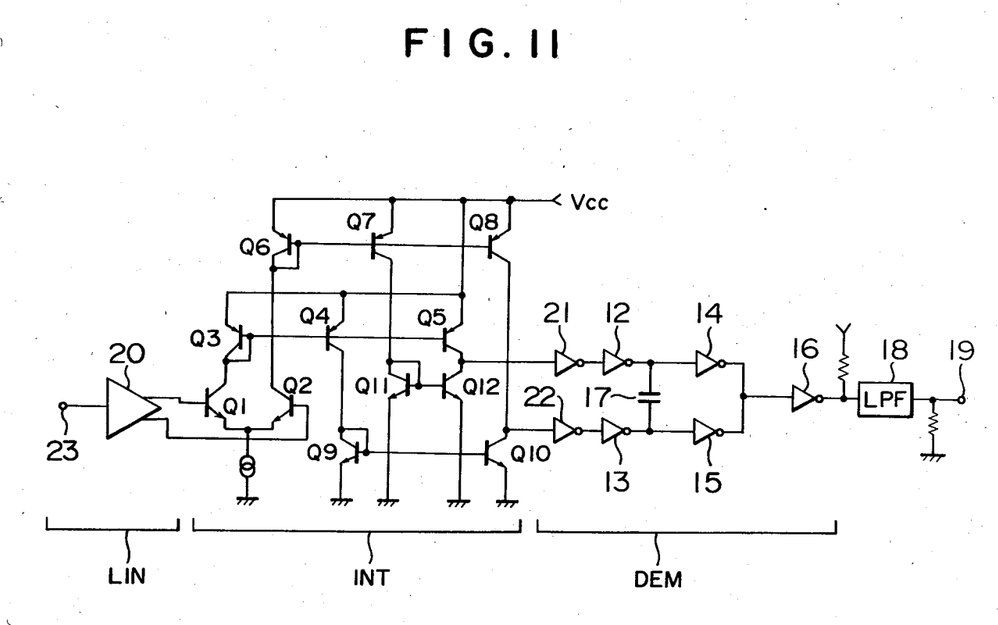
FIG. 11 shows a circuit arrangement to which the invention is applied.

FIG. 11 shows an interface INT interposed between a linear circuit LIN and the FM signal demodulation circuit DEM according to this invention which takes the form of an integrated injection logic. As shown in FIG. 11, a frequency modulated signal 23 is applied to an amplifier 20. Inverters 21 and 22 used as buffer amplifiers do not incorporate dedicated injector current sources. Reference characters $Q_1$ to $Q_{12}$ denote transistors and like reference numerals designate like elements in FIG. 7.

The operation of this circuit of FIG. 11 will now be described briefly. The frequency modulated signal 23 is passed through the amplifier 20 and then applied to the transistors $Q_1$ and $Q_2$ constituting a differential amplifier. When the transistor $Q_1$ is on and the transistor $Q_2$ is off, the transistors $Q_3$, $Q_4$, $Q_5$, $Q_9$ and $Q_{10}$ are rendered on and the transistors $Q_6$, $Q_7$, $Q_8$, $Q_{11}$ and $Q_{12}$ are rendered off to apply a high-level input signal to the inverter 21 and a low-level input signal to the inverter 22.

Conversely, when the transistor $Q_1$ is off and the transistor $Q_2$ is on, the transistors $Q_6$, $Q_7$, $Q_8$, $Q_{11}$ and $Q_{12}$ are rendered on and the transistors $Q_3$, $Q_4$, $Q_5$, $Q_9$ and $Q_{10}$ are rendered off to apply the low-level input signal to the inverter 21 and the high-level input signal to the inverter 22. Output signals from the inverters 21 and 22 are applied to the subsequent stage of the FM signal demodulation circuit according to the present invention which operates as described with reference to FIGS. 7 and 8.

This FM signal demodulation circuit of the above construction has various advantages as follows:

(1) Since the demodulation circuit is constituted by integrated injection logics, the number of cascaded transistor stages can be reduced to one, thereby ensuring low voltage operation at 3 V or less and consequent great contribution to power consumption reduction.

(2) The full balance type (differential type) circuit eliminates the relative delay time to obviate the problem of the carrier leakage even when the delay times of the individual inverters are irregular.

(3) The injector currents to the two inverters 14 and 15 connected with the capacitor 17 can be adjusted separately from and independently of the injector current to the inverters 12, 13 and 16. Consequently, this adjustment can assure easy attainment of desired demodulation characteristics (gain and linearity) and compensation for temperature characteristics.

(4) Since the disposition of the integrated injection logic sections or the demodulation circuit according to the present invention can be isolated from the remaining linear circuits, interference of switching noises attendant upon the demodulation operation with the linear circuits can be suppressed.

Figure 12:
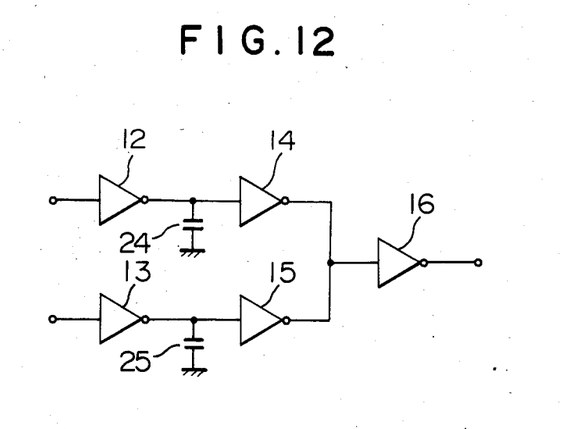
FIG. 12 is a circuit diagram showing another embodiment of the FM signal demodulation circuit in accordance with the invention.

FIG. 12 illustrates another embodiment of the FM signal demodulation circuit according to the present invention. This embodiment is different from the FIG. 5 embodiment in that in place of the capacitor 17 connected between the output terminals of the inverters 12 and 13, there are provided a capacitor 24 connected between the output terminal of the inverter 12 and ground and a capacitor 25 connected between the output terminal of the inverter 13 and ground.

The same advantages as those by the FIG. 5 embodiment can be obtained by the FIG. 12 embodiment, provided that the twin properties of the capacitors 24 and 25 are validly held.

Figure 13:
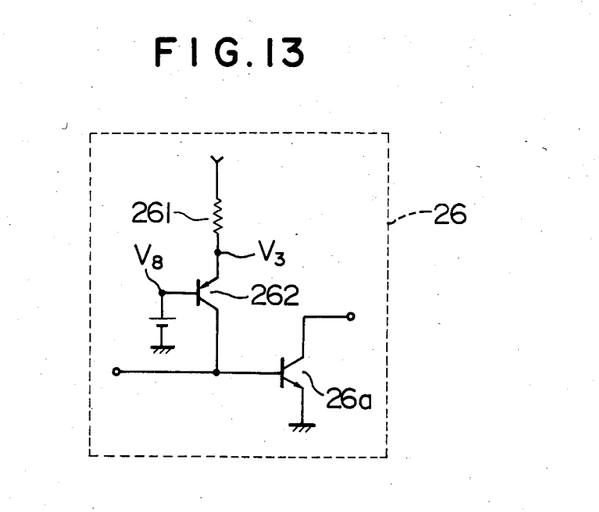
FIG. 13 is a circuit diagram showing another form of the inverter in accordance with the invention.

The foregoing embodiments have been described as using I²Ls (Integrated Injection Logics), but the present invention is in no way limited to the particular I²L inverter type demodulation circuit and inverters in the form of open collector output type TTL (transistor coupled transistor logic) may substitute for the I²L inverters to constitute the FM signal demodulation circuit. In such a modification, an inverter 26 as shown in FIG. 13 typically substitutes for the inverter 12 of FIG. 6B. The inverter 26 is different from the inverter 12 in that the base of a PNP transistor 262 is not grounded but is connected to a positive potential $V_B$ which needs to be 0.3 V or more. This positive potential $V_B$ aims at prevention of saturation of the PNP transistor 262 with promising high speed operation ensured. An NPN transistor 26a plays the part of the transistor 12a shown in FIG. 6B. A resistor 261 also plays the part of the resistor 121 of FIG. 6B. Preferably, for high speed operation of the inverter, the NPN transistor 26a may be a Schottky type transistor which is effective to prevent itself from being saturated. In the construction of FIG. 13, potential $V_3$ is given by the following equation (4):

$$V_3 \simeq V_B + 0.7 \text{ Volts} \qquad (4)$$

and when $V_B$ is selected to be about 0.7 V, the number of cascaded transistor stages is regarded as about two, which is compatible with low voltage operation. However, as far as the low voltage operation is concerned, the I₂L inverter is more advantageous.

The I²L inverter has a device area which is about ⅓ of a device area of the conventional transistor inverter. Accordingly, by applying the I²L inverters to the FM signal demodulation circuit, the area thereof can be reduced as compared to the area of the conventional FM signal demodulation circuit. As well known in the art, the reduction in the area of IC devices contributes to reduction in manufacture cost. Consequently, the FM signal demodulation circuit can be manufactured at low cost.

We claim:

1. An FM signal demodulation circuit comprising:
   a first inverter for receiving a first FM signal;
   a second inverter for receiving a second FM signal of a phase opposite to that of said first FM signal;
   a capacitor connected between output terminals of said first and second inverters;
   a third inverter connected to receive an output signal of said first inverter;
   a fourth inverter connected to receive an output signal of said second inverter; and
   logical product means for ANDing output signals of said third and fourth inverters.

2. An FM signal demodulation circuit according to claim 1 wherein said first to fourth inverters comprise integrated injection logic type inverters so that injector currents to said third and fourth inverters can be adjusted independently of injector currents to said first and second inverters.

3. An FM signal demodulation circuit according to claim 1 wherein said capacitor comprises a MOS type transistor.

4. An FM signal demodulation circuit according to claim 2 wherein said capacitor comprises a MOS type transistor.

5. An FM signal demodulation circuit comprising:
   a first inverter for receiving a first FM signal;
   a second inverter for receiving a second FM signal of a phase opposite to that of said first FM signal;
   a capacitor connected between each of the output terminals of said first and second inverters and ground;
   a third inverter connected to receive an output signal of said first inverter;
   a fourth inverter connected to receive an output signal of said second inverter; and
   logical product means for ANDing output signals of said third and fourth inverters.

6. An FM signal demodulation circuit according to claim 5 wherein said first to fourth inverters comprise integrated injection logic type inverters so that injector currents to said third and fourth inverters can be adjusted independently of injector currents to said first and second inverters.

7. An FM signal demodulation circuit according to claim 5 wherein said capacitor comprises a MOS type transistor.

8. An FM signal demodulation circuit according to claim 6 wherein said capacitor comprises a MOS type transistor.

* * * * *